US010262899B2

(12) United States Patent
Lu et al.

(10) Patent No.: US 10,262,899 B2
(45) Date of Patent: Apr. 16, 2019

(54) METHOD OF PROCESSING WAFER

(71) Applicant: DISCO CORPORATION, Tokyo (JP)

(72) Inventors: Xin Lu, Tokyo (JP); Atsushi Kubo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/385,387

(22) Filed: Dec. 20, 2016

(65) Prior Publication Data

US 2017/0186645 A1 Jun. 29, 2017

(30) Foreign Application Priority Data

Dec. 25, 2015 (JP) .................................. 2015-253368

(51) Int. Cl.
| | |
|---|---|
| H01L 21/78 | (2006.01) |
| H01L 21/02 | (2006.01) |
| H01L 21/304 | (2006.01) |
| H01L 21/56 | (2006.01) |
| H01L 23/544 | (2006.01) |
| H01L 21/683 | (2006.01) |

(52) U.S. Cl.
CPC ........ *H01L 21/78* (2013.01); *H01L 21/02016* (2013.01); *H01L 21/304* (2013.01); *H01L 21/3043* (2013.01); *H01L 21/561* (2013.01); *H01L 21/6836* (2013.01); *H01L 23/544* (2013.01); *H01L 2221/6834* (2013.01); *H01L 2221/68327* (2013.01); *H01L 2223/54453* (2013.01)

(58) Field of Classification Search
CPC ....... H01L 2924/00014; H01L 2924/00; H01L 2224/94; H01L 2924/14; H01L 2224/131
See application file for complete search history.

(56) References Cited

U.S. PATENT DOCUMENTS

| | | | | |
|---|---|---|---|---|
| 6,476,501 B1 * | 11/2002 | Ohuchi | ................... | H01L 21/56 257/778 |
| 8,110,443 B2 * | 2/2012 | Uoya | .................. | H01L 21/6835 257/E21.599 |
| 2009/0243094 A1 * | 10/2009 | Itoh | ....................... | H01L 21/561 257/737 |

FOREIGN PATENT DOCUMENTS

JP 2006-100535 4/2006

* cited by examiner

*Primary Examiner* — Tony Tran
(74) *Attorney, Agent, or Firm* — Greer Burns & Crain, Ltd.

(57) ABSTRACT

A wafer has a plurality of projected dicing lines on a face side thereof, a plurality of devices formed in respective areas demarcated on the face side of the wafer by the projected dicing lines, a plurality of grooves defined in the projected dicing lines, and a molding resin laid on the devices and embedded in the grooves. An outer circumferential portion of the molding resin is removed, exposing the molding resin embedded in the grooves. The molding resin embedded in the grooves exposed on an outer circumferential portion of the wafer is detected, and a laser beam is focused at a transversely central point on the molding resin embedded in the grooves. The laser beam is applied to the molding resin along the grooves, thereby forming dividing grooves in the wafer to allow the wafer to be divided into individual devices.

1 Claim, 17 Drawing Sheets

METHOD OF PROCESSING WAFER

BACKGROUND OF THE INVENTION

Field of the Invention

The present invention relates to a method of processing a wafer having a plurality of projected dicing lines formed in a grid pattern on its face side and a plurality of devices formed in respective areas demarcated on a face side of the wafer by the projected dicing lines, by dividing the wafer into the individual devices along the projected, dicing lines and covering the individual devices with a resin.

Description of the Related Art

In the semiconductor device fabrication process, a plurality of areas are demarcated on the face side of a substantially disk-shaped semiconductor wafer by a plurality of projected dicing lines arranged in a grid pattern on the face side, and devices such as integrated circuits (ICs), large-scale integration (LSI) circuits, etc. are formed in the demarcated areas. The semiconductor wafer thus processed is cut along the projected dicing lines to divide the areas with the devices formed thereon into individual devices.

In recent years, there have been developed packaging technologies wherein a wafer is divided into individual devices and the individual devices are coated with a resin. One of the packaging technologies is referred to as wafer level chip scale packaging (WLCSP), which is disclosed in Japanese Patent Laid-Open No. 2006-100535.

According to the packaging technology disclosed in Japanese Patent Laid-Open No. 2006-100535, the reverse side of a wafer is coated with a resin, cut grooves which reach the resin are formed from the face side of the wafer along projected dicing lines, and a molding resin is laid on the face side of the wafer, covering devices thereon. After the molding resin has been embedded in the cut grooves, the molding resin that has filled the cut grooves is cut by a cutting blade having a thickness smaller than the width of the cut grooves, dividing the wafer into individual package devices referred to as WLCSP.

A technology, to be described below step by step, has been developed as a method of processing a wafer to manufacture package devices referred to as WLCSP.

(1) Cut grooves having a depth corresponding to the finished thickness of devices are formed in a wafer from its face side along projected dicing lines;

(2) A molding resin is laid on the face side of the wafer, and embedded in the cut grooves;

(3) A protective member is applied to the face side of the molding resin laid on the face side of the wafer, and the reverse side of the wafer is ground until the cut grooves are exposed; and (4) The reverse side of the wafer is applied to a dicing tape, and the molding resin embedded in the cut grooves is cut by a cutting blade having a thickness smaller than the width of the cut grooves, dividing the wafer into individual package devices referred to as WLCSP.

SUMMARY OF THE INVENTION

In either of the above processing methods, however, when the molding resin embedded, in the cut grooves is cut by the cutting blade, since the molding resin is laid on the face side of the wafer, the cutting blade is positioned indirectly with respect to the cut grooves formed along the projected dicing lines on the basis of bumps that are formed in the devices as protrusive electrodes exposed on the surface of the molding resin. However, because the bumps and the projected dicing lines are not necessarily in accurate positional relationship to each other, the cutting blade is likely to be displaced from the cut grooves formed along the projected dicing lines, tending to cause damage to side surfaces of the devices that make up WLCSPs.

Therefore, it is an object of the present invention to provide a method of processing a wafer to obtain WLCSPs which are of good quality.

In accordance with an aspect of the present invention, there is provided a method of processing a wafer having a plurality of projected dicing lines on a face side thereof, a plurality of devices formed in respective areas demarcated on the face side of the wafer by the projected dicing lines, a plurality of grooves formed in the projected dicing lines to a depth corresponding to a finished thickness of the devices, and a molding resin laid on the face side of the wafer including the devices and embedded in the grooves. The method includes a molding resin removing step of removing an outer circumferential portion of the molding resin laid on the face side of the wafer, exposing the molding resin embedded in the grooves on the face side of the wafer, and a dividing groove forming step of detecting the molding resin embedded in the grooves exposed on an outer circumferential portion of the wafer, positioning the focused spot of a laser beam at a transversely central point on the molding resin embedded in the grooves, and applying the laser beam to the molding resin along the grooves, thereby forming dividing grooves in the wafer to allow the wafer to be divided into individual devices after performing the molding resin removing step.

Preferably, the method further includes a reverse side grinding step of grinding a reverse side of the wafer to a finished thickness of the devices before performing the dividing groove forming step. The dividing grooves of a depth allowing the wafer to be divided into the individual devices are formed in the dividing groove forming step.

Preferably, the dividing grooves of a depth corresponding to a finished thickness of the devices are formed in the dividing groove forming step. The method further includes a protective member applying step of applying a protective member to the face side of the wafer on which the dividing groove forming step is performed; and a reverse side grinding step of grinding a reverse side of the wafer to a finished thickness of the devices, thereby exposing the dividing grooves to allow the wafer to be divided into the individual devices.

With the method of processing a wafer according to the present invention, since the transversely central point on the molding resin embedded in the grooves exposed on the face side of the outer circumferential portion of the wafer is positioned immediately below a beam condenser in the dividing groove forming step, the laser beam is applied to the transversely central point on the molding resin embedded in the grooves along the grooves even though the molding resin is laid on the face side of the wafer, so that the devices on the wafer will not be damaged.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
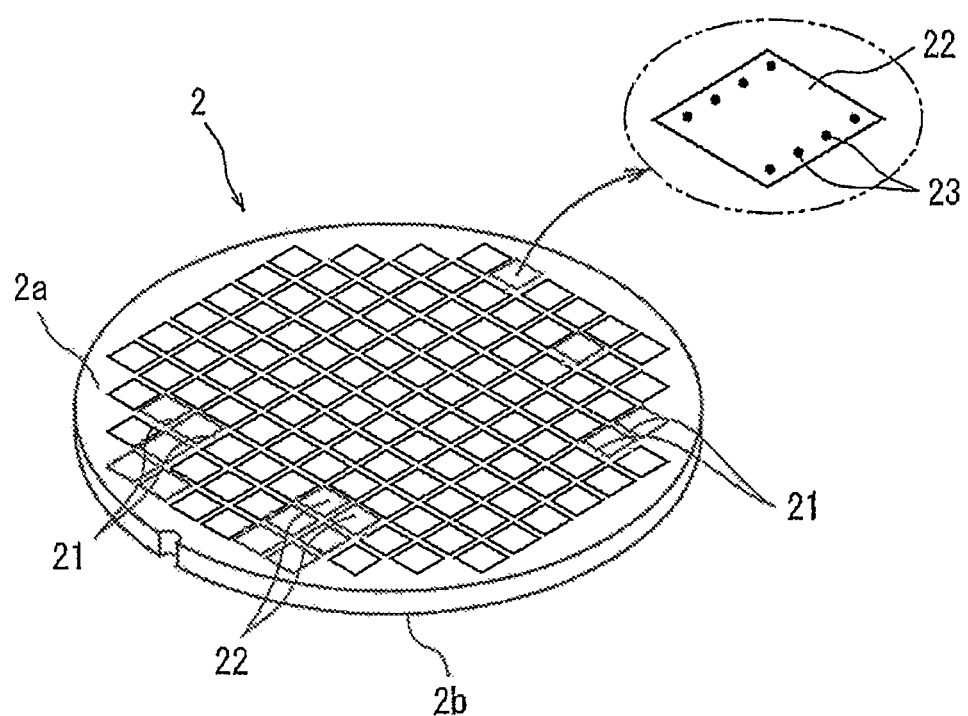
FIG. 1 is a perspective view of a semiconductor wafer.

Methods of processing a wafer according to preferred embodiments of the present invention will be described in detail below with reference to the accompanying drawings. FIG. 1 depicts in perspective a semiconductor wafer to be processed by a method of processing a wafer according to an embodiment of the present invention. The semiconductor wafer, generally denoted by 2 in FIG. 1, includes a silicon wafer having a thickness of 600 μm, for example. The semiconductor wafer 2 has a plurality of projected dicing lines 21 formed on a face side 2a thereof in a grid-like pattern and devices 22 such as ICs, LSI circuits, etc. formed in a plurality areas demarcated by the projected dicing lines 21. The devices 22 are identical in structure to each other. Each of the devices 22 has a plurality of bumps 23 serving as protrusive electrodes on its face side. The method of processing a wafer according to the embodiment, which divides the semiconductor wafer 2 into individual devices 22 along the projected dicing lines 21 and coats the individual devices 22 with a layer of resin, will be described below.

Figure 2:
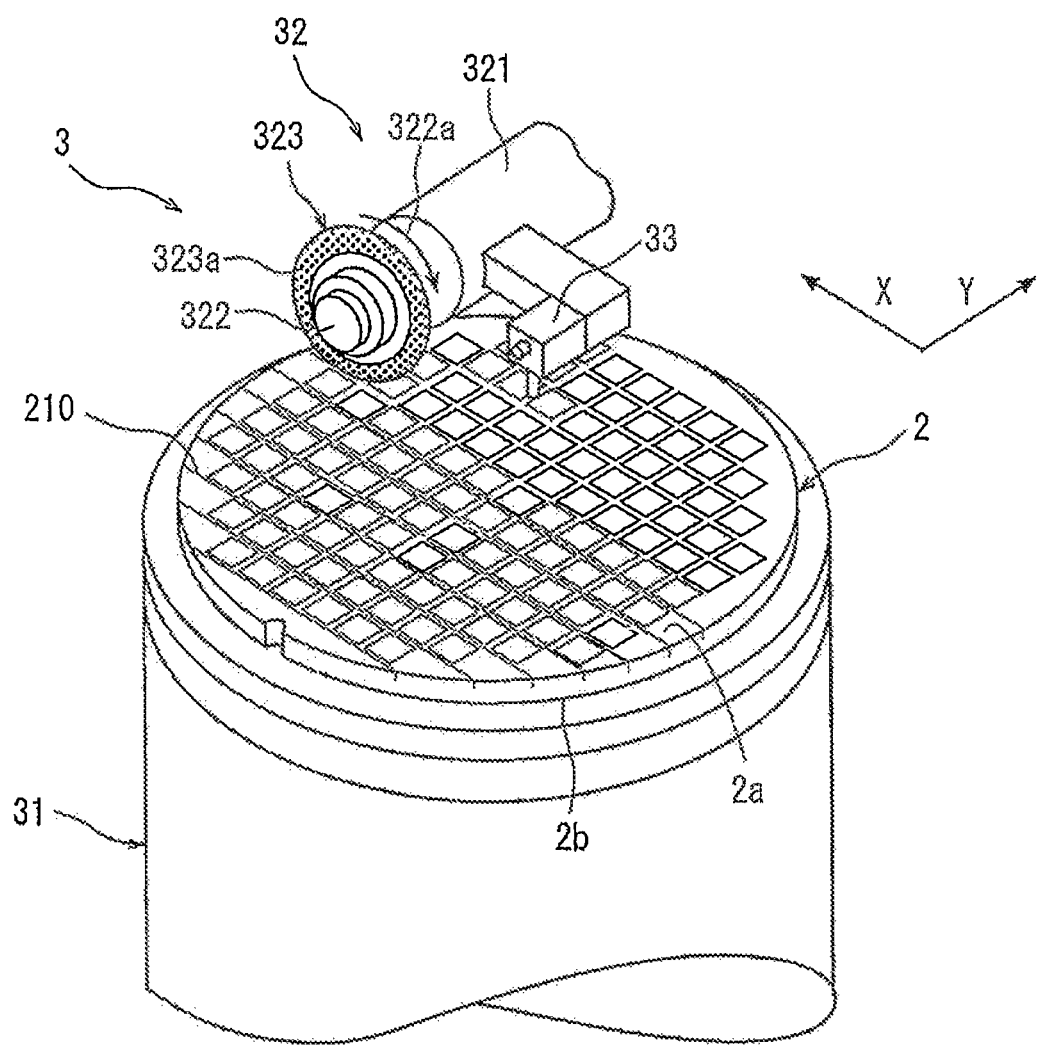
FIG. 2 is a fragmentary perspective view of a cutting apparatus for carrying out a groove forming step of a method of processing a wafer according to an embodiment of the present invention.

First, a groove forming step is carried out to form, in the semiconductor wafer 2, grooves having a depth corresponding to the finished thickness of the devices 22 along the projected dicing lines 21 from the face side 2a of the semiconductor wafer 2. According to the present embodiment, the groove forming step is carried out using a cutting apparatus 3 depicted in FIG. 2. As depicted in FIG. 2, the cutting apparatus 3 includes a chuck table 31 for holding a workpiece, i.e., the semiconductor wafer 2, thereon, cutting means 32 for cutting the workpiece held on the chuck table 31, and image capturing means 33 for capturing an image of the workpiece held on the chuck table 31. The chuck table 31 is arranged to hold the workpiece under suction, and is movable by cutting feed means, not depicted, in a cutting feed direction indicated by the arrow X in FIG. 2 and also movable by indexing feed means, not depicted, in an indexing feed direction indicated by the arrow Y in FIG. 2.

The cutting means 32 includes a spindle housing lying essentially horizontally, a rotary spindle 322 rotatably supported by the spindle housing 321, and a cutting blade 323 having an annular cutter 323a mounted on the tip end of the rotary spindle 322. The rotary spindle 322 is rotatable in the direction indicated by the arrow 322a by a servomotor, not depicted, disposed in the spindle housing 321. The thickness of the annular cutter 323a of the cutting blade 323 is set to 40 μm in the present embodiment. The image capturing means 33 includes optical means such as a microscope, a charge-coupled device (CCD) camera, etc., and sends a captured image signal to control means, not depicted.

For carrying out the groove forming step using the cutting apparatus 3, the semiconductor wafer 2 is placed, with its reverse side 2b down, on the chuck table 31, as depicted in FIG. 2, and is held under suction on the chuck table 31 by actuating suction means, not depicted. Therefore, the semiconductor wafer 2 held on the chuck table 31 has its face side 2a facing upwardly. The chuck table 31 with the semiconductor wafer 2 held under suction thereon is positioned immediately below the image capturing means 33 by the cutting feed means, not depicted.

After the chuck table 31 has been positioned immediately below the image capturing means 33, an alignment step is performed by the image capturing means and the non-illustrated control means to detect cutting region where dividing grooves are to be formed along the projected dicing lines 21 on the semiconductor wafer 2. Specifically, the image capturing means 33 and the non-illustrated control means carry out an image processing process such as pattern matching, etc. for positioning a projected dicing line 21 extending on the semiconductor wafer 2 along a prescribed direction in alignment with the cutting blade 323, thereby performing alignment of the cutting region (alignment step). Similar alignment of the cutting region is performed with respect to a projected dicing line 21 extending on the semiconductor wafer 2 along a direction perpendicular to the above prescribed direction.

Figure 3A:
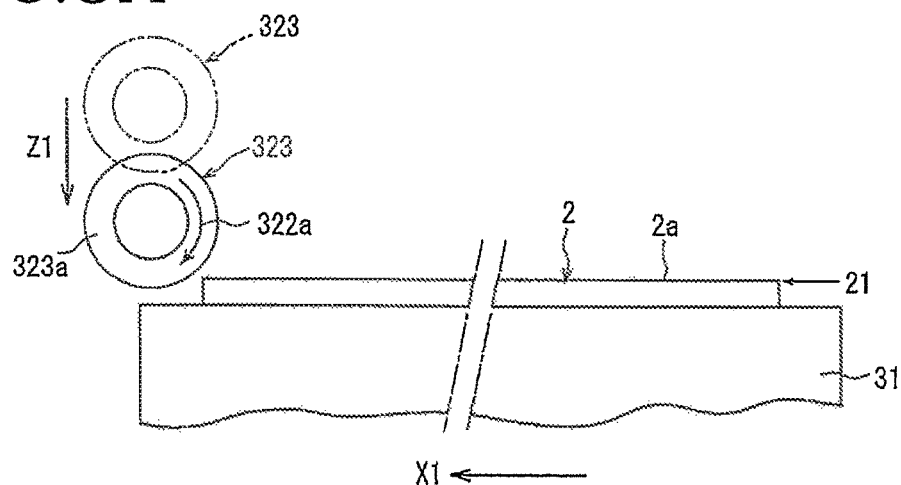
FIGS. 3A through 3D are views illustrating the groove forming step according to the embodiment.

After the alignment step has been carried out to detect the cutting region on the semiconductor wafer 2 held on the chuck table 31, the chuck table 31 which is holding the semiconductor wafer 2 is moved to a cutting start position for the cutting region. At this time, as depicted in FIG. 3A, the semiconductor wafer 2 is positioned in order to hold an end left end in FIG. 3A) of the projected dicing line 21 slightly on the right side of a position immediately below the annular cutter 323a of the cutting blade 323. Then, the cutting blade 323 is incising-fed downwardly as indicated by the arrow Z1 from a standby position indicated by the two-dot-and-dash lines in FIG. 3A, and positioned in a prescribed incising feed position as indicated by the solid lines in FIG. 3A. In the incising feed position, the lower end of the annular cutter 323a of the cutting blade 323 is set to a depth (e.g., 200 μm), which corresponds to the finished device thickness, from the face side 2a of the semiconductor wafer 2, as depicted in FIGS. 3A and 3C.

Then, the cutting blade 323 is rotated about its own axis in the direction indicated by the arrow 322a in FIG. 3A at a prescribed rotational speed, and the chuck table 31 is moved in the direction indicated by the arrow X1 in FIG. 3A at a prescribed cutting feed speed. When the other end (right end in FIG. 3B) of the projected dicing line 21 reaches a position slightly on the left side of a position immediately below the annular cutter 323a of the cutting blade 323, the chuck table 31 is stopped. By thus cutting-feeding the chuck table 31, a groove (cut groove) 210 having a width of 40 µm is formed in the semiconductor wafer 2 to a depth (e.g., 200 µm) corresponding to the finished device thickness from the face side 2a along the projected dicing line 21 as depicted in FIG. 3D.

Figure 3B:
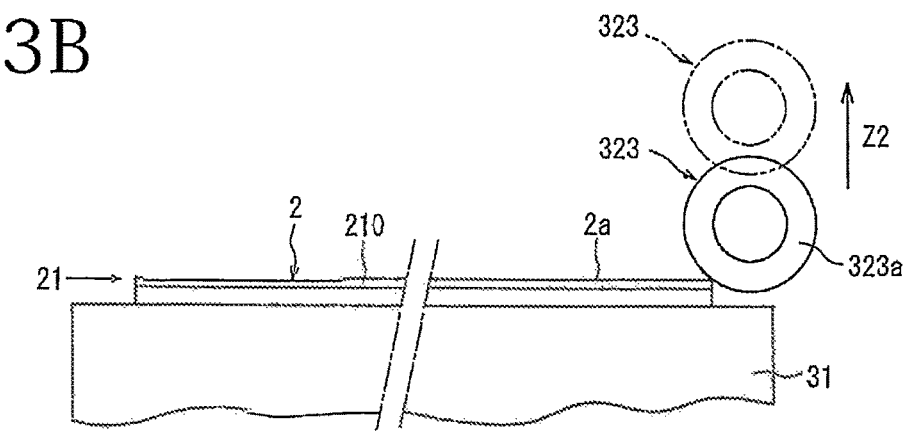
Figure 3C:
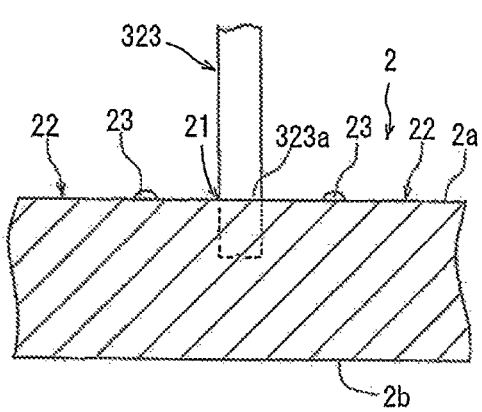
Figure 3D:
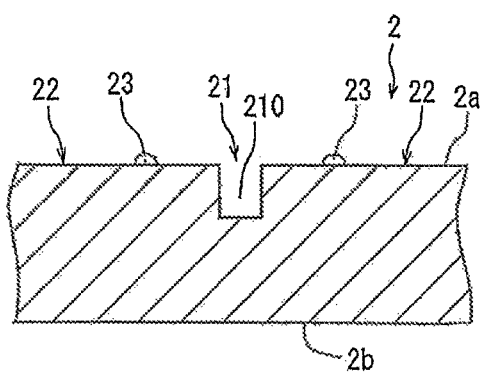

Then, the cutting blade 323 is lifted as indicated by the arrow Z2 in FIG. 3B and positioned back in the standby position indicated by the two-dot-and-dash lines. The chuck table 31 is moved in the direction indicated by the arrow X2 in FIG. 3B back to the position depicted in FIG. 3A. The chuck table 31 is then indexing-fed by a distance corresponding to the interval between adjacent projected dicing lines 21 in a direction (indexing feed direction) perpendicular to the sheet of FIGS. 3A and 3B, positioning a next projected dicing line 21 along which to cut the semiconductor wafer 2 in alignment with the cutting blade 323. After the next projected dicing line 21 has been aligned with the cutting blade the above groove forming step is repeated. The groove forming step is carried out on all the projected dicing lines 21 on the semiconductor wafer 2.

In the above groove forming step, the groove (cut groove) 210 is formed in the semiconductor wafer 2 to a depth corresponding to the finished device thickness from the face side 2a along the projected dicing line 21 by the cutting blade 323 of the cutting apparatus 3. However, in the groove forming step, a laser-processed groove may be formed in the semiconductor wafer 2 to a depth corresponding to the finished device thickness by a laser beam applied to the semiconductor wafer 2 along the projected dicing line 21.

Figure 4A:
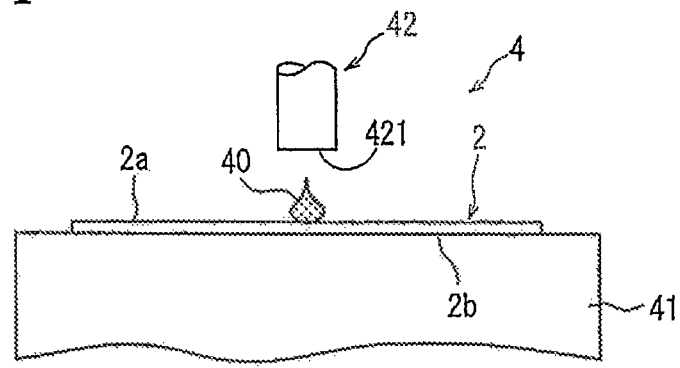
FIGS. 4A through 4C are views illustrating a molding step according to the embodiment.
Figure 4B:
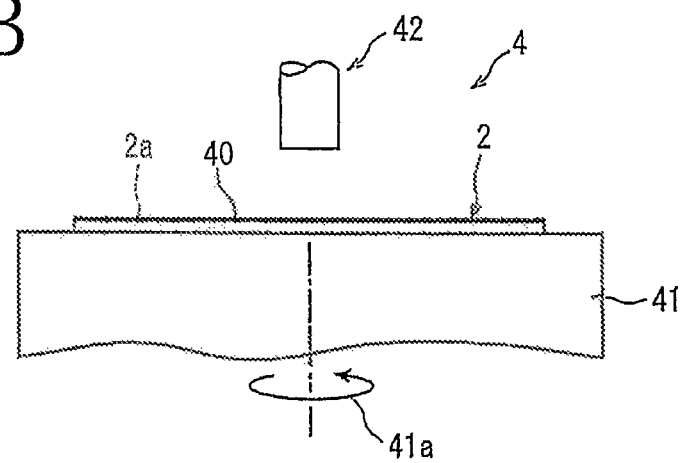
Figure 4C:
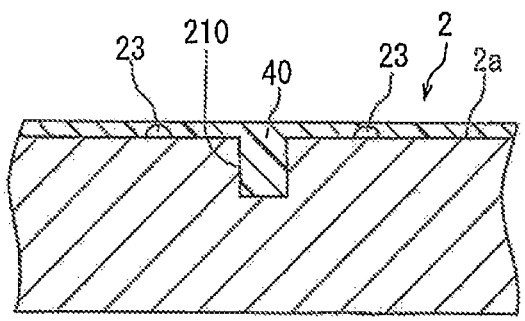

Thereafter, a molding step is carried out to lay a molding resin on tube face side including the devices of the semiconductor wafer 2 on which the groove forming step has been performed and embed the molding resin in the grooves 210. In the molding step, as depicted in FIG. 4A, the reverse side 2b of the semiconductor wafer 2 is placed on an upper surface of a holding table 41 of a resin coating apparatus 4. Suction means, not depicted, is actuated to hold the semiconductor wafer 2 under suction on the holding surface of the holding table 41. Therefore, the semiconductor wafer held on the holding table 41 has its face side 2a facing upwardly. After the semiconductor wafer 2 has been held on the holding table 41, as depicted in FIG. 4A, an ejection port 421 of a resin supply nozzle 42 is positioned above the center of the semiconductor wafer 2 on the holding table 41, and resin supply means, not depicted, is actuated to drop a prescribed amount of molding resin 40 from the ejection port 421 of the resin supply nozzle 42 onto a central area of the face side 2a of the semiconductor wafer 2. After the prescribed amount of molding resin 40 has been dropped onto the central area of the face side 2a of the semiconductor wafer 2, the holding table 41 is rotated about its own axis in the direction indicated by the arrow 41a in FIG. 4B at a predetermined rotational speed for a predetermined period of time, laying or spreading the molding resin 40 over the face side 2a of the semiconductor wafer 2 and embedding the molding resin 40 in the grooves 210, as depicted in FIGS. 4B and 4C. In the present embodiment, the molding resin 40 includes a thermosetting liquid resin (epoxy resin). After being laid over the face side 2a of the semiconductor wafer 2 and embedded in the grooves 210, the molding resin 40 is cured by being heated to approximately 150° C.

Figure 5A:
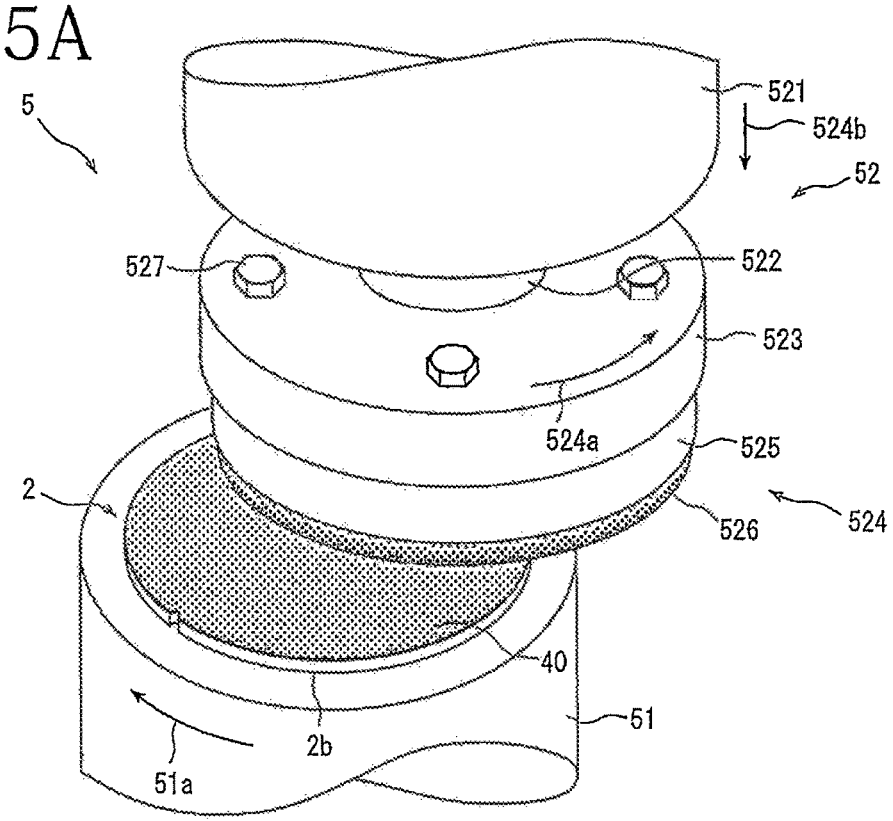
FIGS. 5A through 5C are views illustrating a bump exposing step according to the embodiment.

Then, a bump exposing step is carried out to polish the molding resin 40 laid on the face side 2a of the semiconductor wafer 2 and expose the bumps 23 formed on the face sides of the devices 22. The bump exposing step is carried out using a polishing apparatus 5 depicted in FIG. 5A. As depicted in FIG. 5A, the polishing apparatus 5 includes a chuck table 51 for holding a workpiece i.e., the semiconductor wafer 2, thereon, and polishing means 52 for polishing the workpiece held on the chuck table 51. The chuck table 51 is arranged to hold the workpiece under suction on its upper surface, and is rotatable in the direction indicated by the arrow 51a in FIG. 5A by a rotary actuating mechanism, not depicted. The polishing means 52 includes a spindle housing 521, a rotary spindle 522 rotatably supported by the spindle housing 521 and rotatable by a rotary actuating mechanism, not depicted, a mounter 523 mounted on the lower end of the rotary spindle 522, and a polishing tool 524 attached to the lower surface of the mounter 523. The polishing tool 524 includes a circular base 525 and a polishing pad 526 mounted on the lower surface of the base 525. The base 525 is fastened to the lower surface of the mounter 523 by fastening bolts 527. According to the present embodiment, the polishing pad 526 is made of felt mixed with abrasive grains of silica as a polishing material.

Figure 5B:
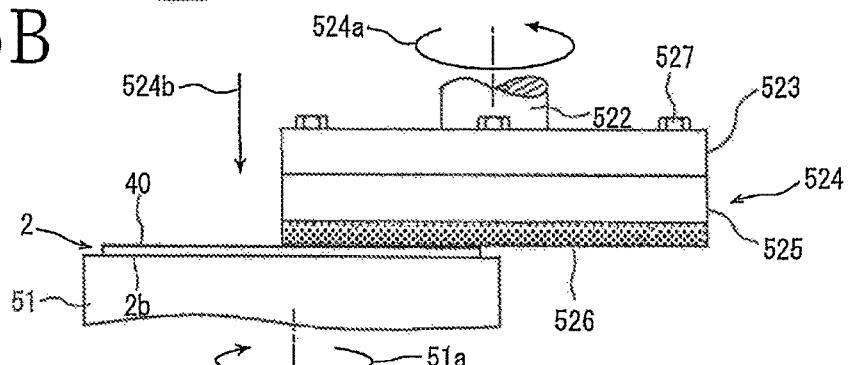
Figure 5C:
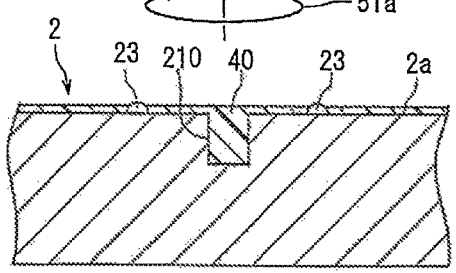

For carrying out the bump exposing step using the polishing apparatus 5, the reverse side 2b of the semiconductor wafer 2 on which the molding step has been performed is placed on the upper surface (holding surface) of the chuck, table 51, as depicted in FIG. 5A. Then, suction means, not depicted, is actuated to hold the semiconductor wafer 2 under suction on the chuck table 51 (wafer holding step). Therefore, the semiconductor wafer 2 held on the chuck table 51 has the molding resin 40 on the face side 2a facing upwardly. After the semiconductor wafer 2 has been held under suction on the chuck table 51, the polishing tool 524 of the polishing means 52 is rotated in the direction indicated by the arrow 524a as depicted in FIG. 5A at a prescribed rotational speed, while at the same time the chuck table 51 is rotated in the direction indicated by the arrow 51a as depicted in FIG. 5A at a prescribed rotational speed, the polishing pad 526 is brought into contact with the upper surface, which serves as a processed surface, of the molding resin 40 laid on the face side 2a, as depicted in FIG. 5B, and the polishing tool 524 is polishing-fed downwardly, i.e., in a direction perpendicular to the holding surface of the chuck table 51, at a prescribed polishing-feed speed by a prescribed distance, as indicated by the arrow 524b in FIGS. 5A and 5B. As a result, the molding resin 40 laid on the face side 2a is polished, exposing the bumps 23 formed on the face sides of the devices 22, as depicted in FIG. 5C.

If the molding resin 40 is laid on the face side 2a of the semiconductor wafer 2 in a manner not to cover the bumps 23 in the molding step, then the above bump exposing step may not necessarily be required.

Figure 6A:
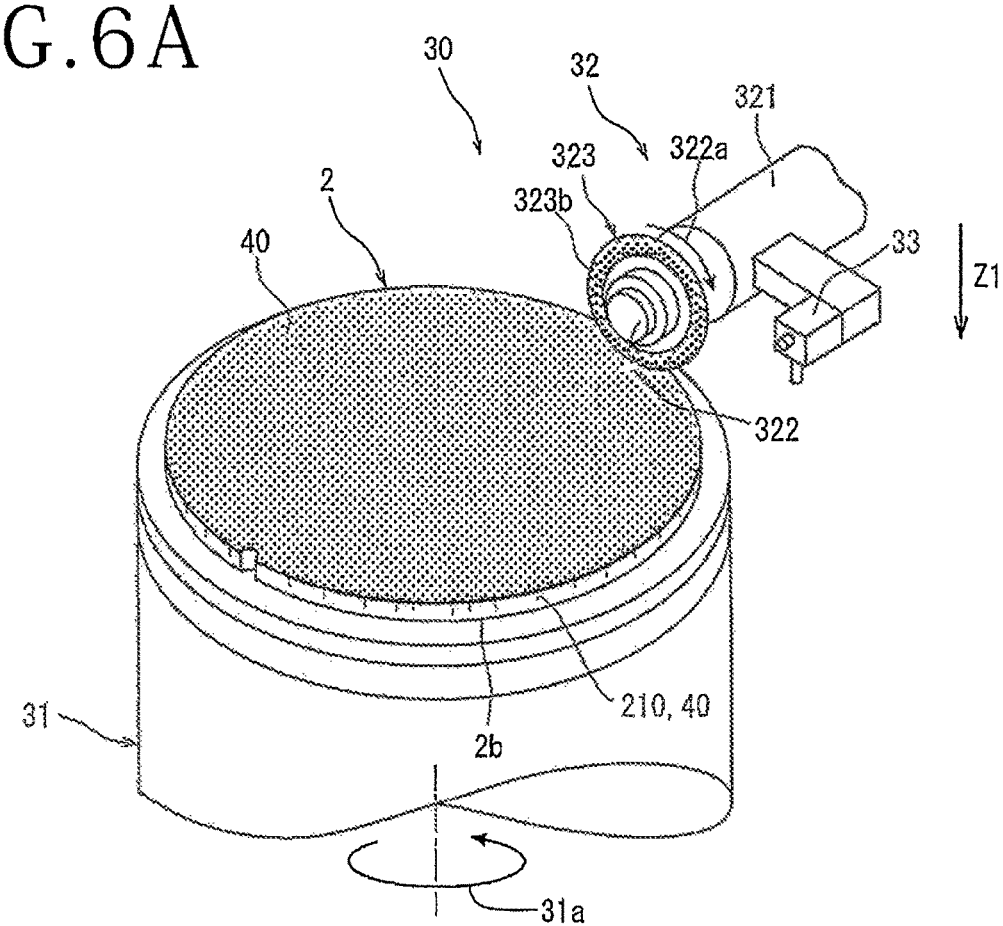
FIGS. 6A and 6B are views illustrating a molding resin removing step according to the embodiment.

Then, a molding resin removing step is carried out to remove an outer circumferential portion of the molding resin 40 laid on the face side 2a of the semiconductor wafer 2, exposing the molding resin embedded in the grooves 210 on the face side 2a of the semiconductor wafer 2. The molding resin removing step is carried out in the present embodiment using a cutting apparatus 30 depicted in FIG. 6A. The cutting apparatus 30 depicted in FIG. 6A is structurally identical to the cutting apparatus 3 depicted in FIG. 2 except for the annular cutter 323*a* of the cutting blade 323 of the cutting apparatus 3. Consequently, those parts of the cutting apparatus 30 which are identical to the corresponding ones of the cutting apparatus 3 are denoted by identical reference symbols, and will not be described below. An annular cutter 323*b* of the cutting blade 323 of the cutting apparatus 30 depicted in FIG. 6A has a thickness set to a range from 2 to 3 mm.

For carrying out the molding resin removing step using the cutting apparatus 30 depicted in FIG. 6A, the reverse side 2*b* of the semiconductor wafer 2 is placed on the chuck table 31 of the cutting apparatus 30. Then, the non-illustrated suction means is actuated to hold the semiconductor wafer 2 under suction on the chuck table 31. Therefore, the semiconductor wafer 2 held on the chuck table 31 has the molding resin 40 on the face side 2*a* of the semiconductor wafer 2 facing upwardly. The chuck table 31 with the semiconductor wafer 2 held under suction thereon is moved to a cutting area where it is to be cut by the cutting blade 323, whereupon the outer circumferential portion of the semiconductor wafer 2 is positioned immediately below the cutting below 323.

Then, the cutting blade 323 is rotated about its own axis in the direction indicated by the arrow 322*a* in FIG. 6A at a prescribed rotational speed, and incising-fed downwardly as indicated by the arrow Z1 to an incising feed position which is set to reach the face side of the molding resin 40 laid on the semiconductor wafer 2. The chuck table 31 is rotated about its own axis to make one revolution as indicated by the arrow 31*a* in FIG. 6A. As a consequence, the outer circumferential portion of the molding resin 40 on the face side 2*a* of the semiconductor wafer 2 is removed as annular debris, exposing the molding resin 40 embedded in the grooves 210 on the face side 2*a* of the semiconductor wafer 2.

In the present embodiment, the outer circumferential portion of the molding resin 40 on the face side 2*a* of the semiconductor wafer 2 is removed, as annular debris. However, the outer circumferential portion of the molding resin 40 may be partly removed.

Figure 7A:
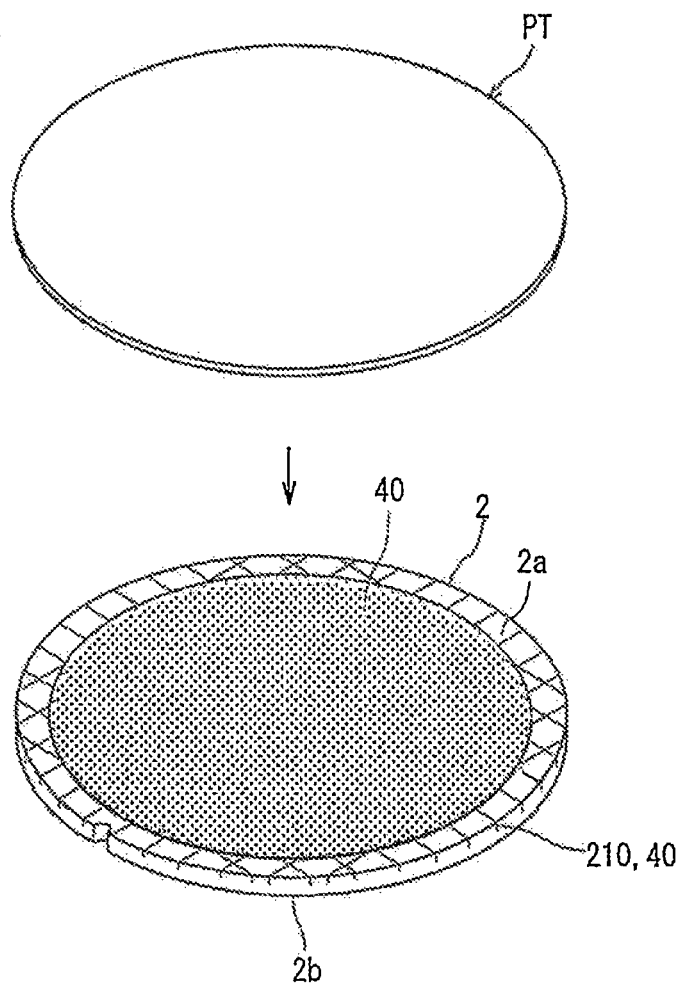
FIGS. 7A and 7B are views illustrating a protective member applying step according to the embodiment.
Figure 7B:
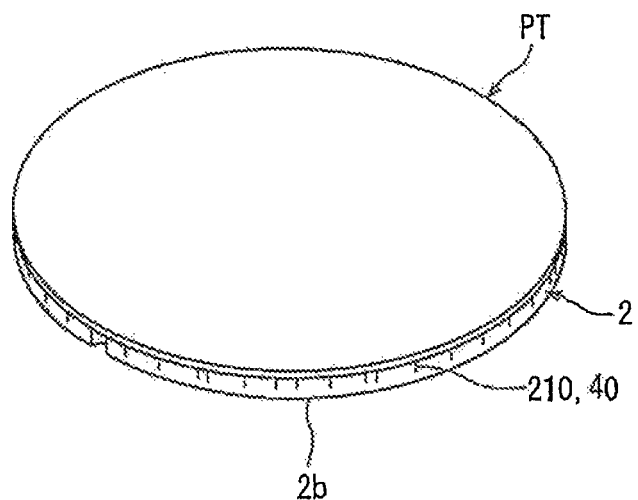

The molding resin removing step thus carried out is followed by a protective member applying to apply a protective member to the fade side 2*a* of the semiconductor wafer 2. Specifically, in the protective member applying step, a protective tape TP is applied as a protective member to the face side 2*a* of the semiconductor wafer 2 and the molding resin 40 laid thereon on which molding resin removing step has been carried out, as depicted in FIGS. 7A and 7B.

Figure 8A:
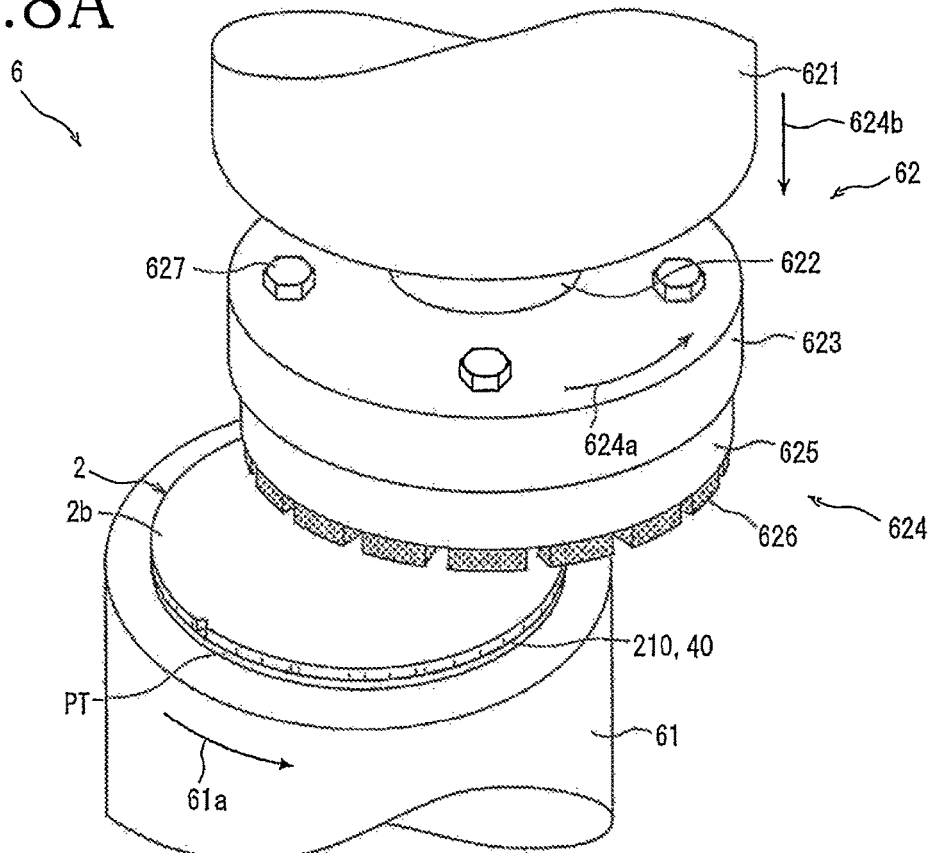
FIGS. 8A through 8C are views illustrating a reverse side grinding step according to the embodiment.

Then, a reverse side grinding step is carried out to grind the reverse side 2*b* of the semiconductor wafer 2 on which the protective member applying step has been performed, to the finished device thickness, thereby exposing the molding resin 40 embedded in the grooves 210. The reverse side grinding step is carried out using a grinding apparatus 6 depicted in FIG. 8A. As depicted in FIG. 8A, the grinding apparatus 6 includes a chuck table 61 for holding a workpiece, i.e., the semiconductor wafer 2, thereon, and grinding means 62 for grinding the workpiece held on the chuck table 61. The chuck table 61 is arranged to hold the workpiece under suction on its upper surface as a holding surface, and is rotatable in the direction indicated by the arrow 61*a* in FIG. 8A by a rotary actuating mechanism, not depicted. The grinding means 62 includes a spindle housing 621, a rotary spindle 622 rotatably supported by the spindle housing 621 and rotatable by a rotary actuating mechanism, not depicted, a mounter 623 mounted on the lower end of the rotary spindle 622, and a grinding wheel 624 attached to the lower surface of the mounter 623. The grinding wheel 624 includes an annular base 625 and a plurality of grinding stones 626 mounted in an annular pattern on the lower surface of the base 625. The base 625 is fastened to the lower surface of the mounter 623 by fastening bolts 627.

Figure 8B:
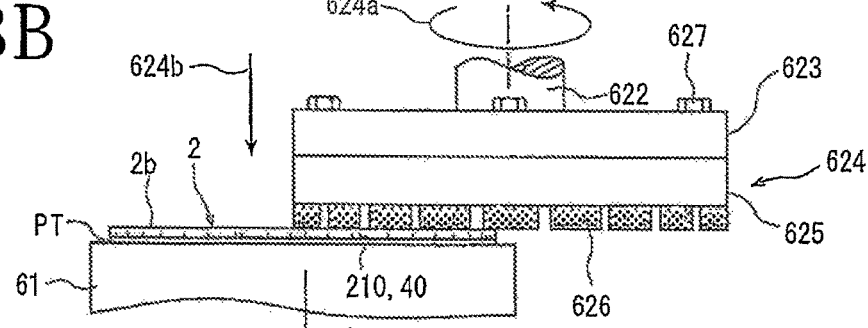
Figure 8C:
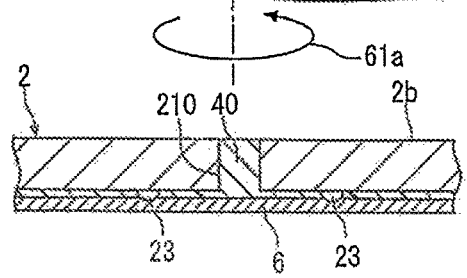

For carrying out the reverse side grinding step using the grinding apparatus 6, the protective tape PT on the semiconductor wafer 2 on which the protective member applying step has been carried out is placed on the upper surface (holding surface) of the chuck table 61, as depicted in FIG. 8A. Then, suction means, not depicted, is actuated to hold the semiconductor wafer 2 under suction on the chuck table 61 with the protective tape PT interposed therebetween. Therefore, the semiconductor wafer 2 held on the chuck table 61 has its reverse side 2*b* facing upwardly. After the chuck table 61 has held the semiconductor wafer 2 under suction thereon with the protective tape PT interposed therebetween, the chuck table 61 is rotated about its own axis at approximately 300 rpm, for example, in the direction indicated by the arrow 61*a* in FIG. 8A, while at the same time the grinding wheel 624 of the grinding means 62 is rotated about its own axis at 6000 rpm, for example, in the direction indicated by the arrow 624*a* in FIG. 8A. As depicted in FIG. 8B, the grinding stones 626 are brought into contact with the reverse side 2*b*, which serves as a processed surface, of the semiconductor wafer 2, and the grinding wheel 624 is grinding-fed downwardly, i.e., in a direction perpendicular to the holding surface of the chuck table 61, at a grinding-feed speed of 1 μm/second, for example, by a prescribed distance, as indicated by the arrow 624*b* in FIGS. 8A and 8B. As a result, the reverse side 2*b* of the semiconductor wafer 2 is ground, exposing the molding resin 40 embedded in the grooves 210 on the reverse side 2*b* of the semiconductor wafer 2 as depicted in FIG. 8C.

Figure 9:
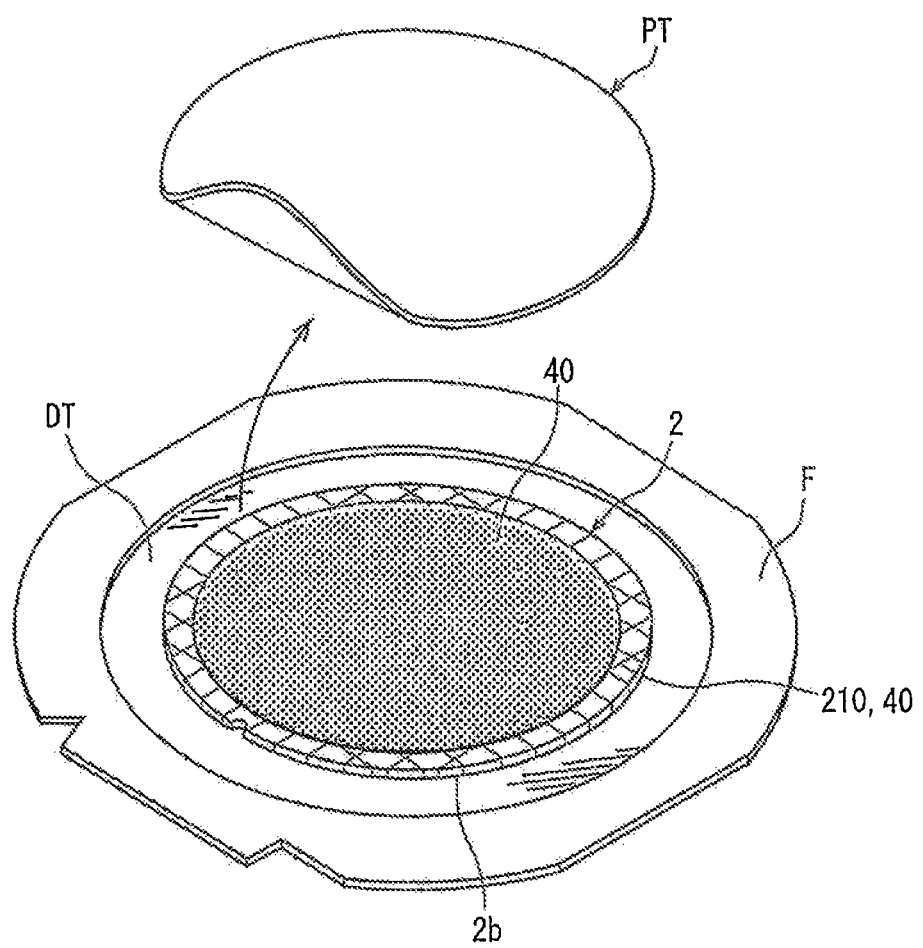
FIG. 9 is a perspective view illustrating a wafer supporting step according to the embodiment.

After the reverse side grinding step has been carried out, the reverse side 2*b* of the semiconductor wafer 2 on which revere side grinding step has been carried out is applied to the face side of a dicing tape DT whose outer circumferential portion is mounted on an annular frame F in a manner to cover the inner opening of the annular frame F, as depicted in FIG. 9. Then, the protective tape PT applied to the face side 2*a* of the semiconductor wafer 2 is peeled off (wafer supporting step). Therefore, the semiconductor wafer 2 applied to the face side of the dicing tape DT has the molding resin 40 on the face side 2*a* facing upwardly.

Figure 10:
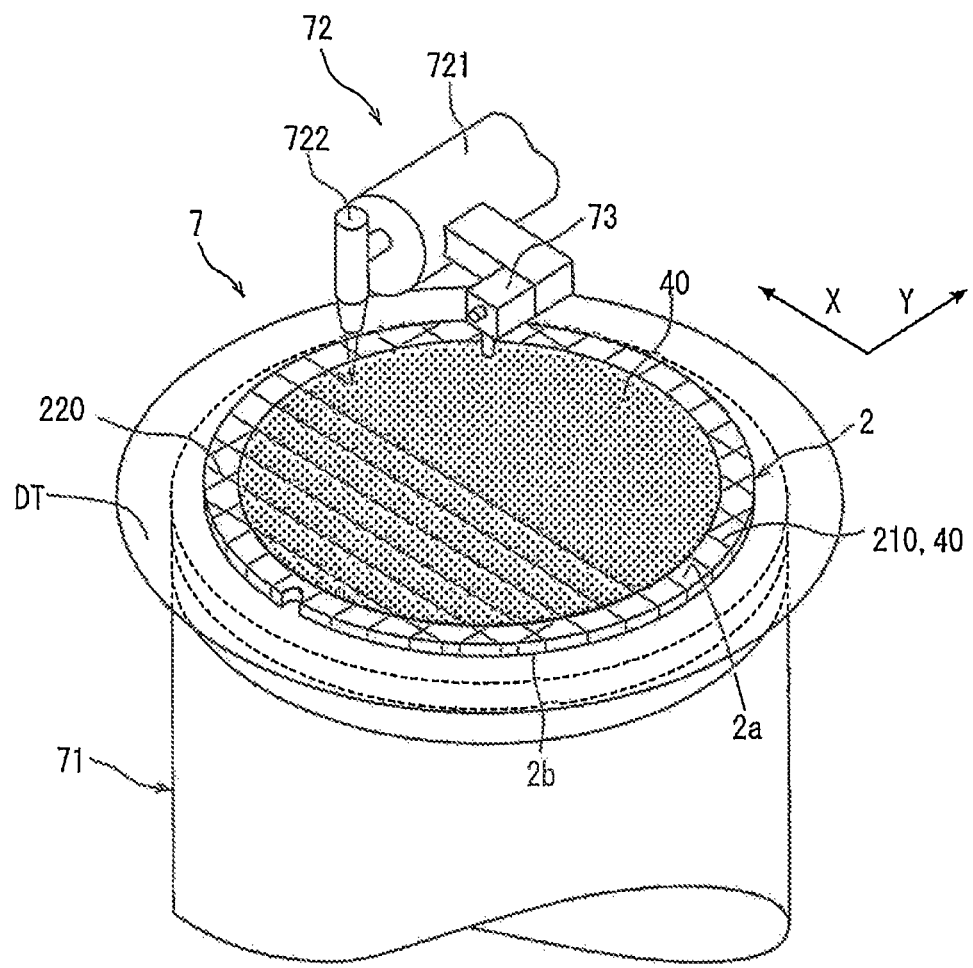
FIG. 10 is a fragmentary perspective view of a laser processing apparatus for carrying out a dividing groove forming step according to the embodiment.

Then, a dividing groove forming step is carried out to detect the molding resin 40 embedded in the grooves 210 exposed on the face side of the outer circumferential portion of the semiconductor wafer 2, position the focused spot of a laser beam at a transversely central point on, the molding resin 40 embedded in each of the grooves 210, and apply the laser beam to the molding resin 40 along each of the grooves 210, thereby forming dividing grooves along which to divide the semiconductor wafer 2 into individual devices. The dividing groove forming step is carried out using a laser processing apparatus 7 depicted in FIG. 10. As depicted in FIG. 10, the laser processing apparatus 7 includes a chuck table 71 for holding a workpiece, i.e., the semiconductor wafer 2, thereon, laser beam applying means 72 for applying a laser beam to the workpiece held on the chuck table 71, and image capturing means 73 for capturing an image of the workpiece held on the chuck table 71. The chuck table 71 is arranged to hold the workpiece under suction, and is movable by cutting feed means, not depicted, in a cutting feed direction indicated by the arrow X in FIG. 10 and also movable by indexing feed means, not depicted, in an indexing feed direction indicated by the arrow Y in FIG. 10.

The laser beam applying means 72 applies a pulsed laser beam from a beam condenser 722 mounted on the tip end of a hollow cylindrical casing 721 that lies essentially horizontally. In the illustrated embodiment, the diameter of the focused spot of the pulsed laser beam applied from the beam condenser 722 is set to 10 μm which is smaller than the width of the grooves 210. The image capturing means 73 mounted on the tip end of the casing 721 of the laser beam applying means 72 includes illuminating means for illuminating the workpiece, an optical system for capturing an area illuminated by the illuminating means, and image capturing means (CCD) for capturing an image of the area captured by the optical system. The image capturing means sends a captured image signal to control means, not depicted.

For carrying out the dividing groove forming step using the laser processing apparatus 7 depicted in FIG. 10, the dicing tape DT on the semiconductor wafer 2 on which the wafer supporting step has been performed is placed on the chuck table 71 depicted in FIG. 10. Then, suction means, not depicted, is actuated to hold the semiconductor wafer 2 under suction on the chuck table 71 with the protective tape PT interposed therebetween. Therefore, the semiconductor wafer 2 held on the chuck table 71 has the molding resin 40 on the face side 2a facing upwardly. Though the annular frame F on which the dicing tape DT is mounted is omitted from illustration in FIG. 10, the annular frame F is held by appropriate frame holding means disposed on the chuck table 71. The chuck table 71 with the semiconductor wafer 2 held under suction thereon is positioned immediately below the image capturing means 73 by processing feed means, not depicted.

After the chuck table 71 has been positioned immediately below the image capturing means 73, an alignment step is performed by the image capturing means 73 and the non-illustrated control means to detect a cutting region where the molding resin 40 embedded in the grooves 210 formed in the semiconductor wafer 2 is to be cut. Specifically, the image capturing means 3 and the non-illustrated control means carry out an alignment step for positioning the molding resin 40 embedded in a groove 210 exposed on the outer circumferential portion of the semiconductor wafer 2 and extending in a first direction and the beam condenser 722 of the laser beam applying means 72 for applying the laser beam along the molding resin 40 embedded in the groove 210 in alignment with each other (aligning step). Similar alignment of the cutting region is performed with respect to the molding resin 40 embedded in a groove 210 extending in a second direction perpendicular to the above first direction. In the aligning step, since the molding resin 40 embedded in the grooves 210 is exposed on the face side of the outer circumferential portion of the semiconductor wafer 2, the molding resin 40 embedded in the grooves 210 can clearly be detected by capturing an image thereof with the image capturing means 73.

Figure 11A:
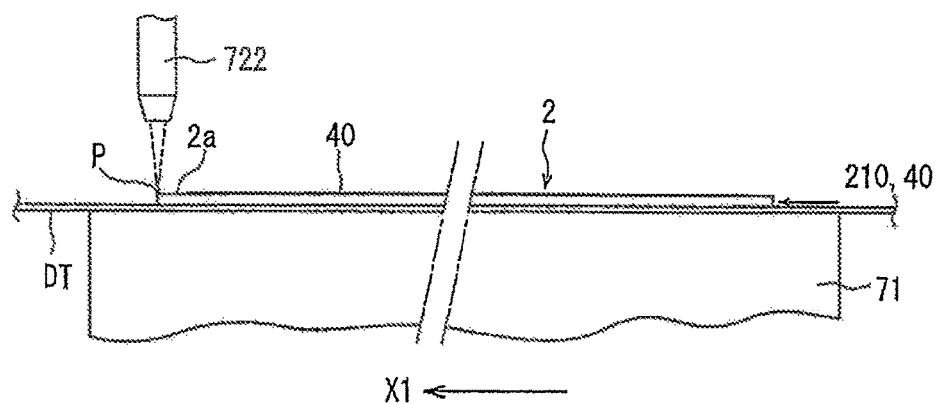
FIGS. 11A through 11D are views illustrating the dividing groove forming step according to the embodiment.
Figure 11B:
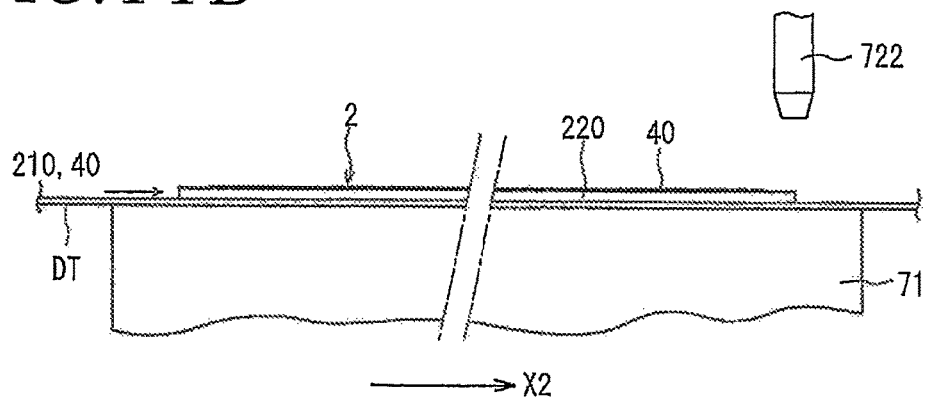
Figure 11C:
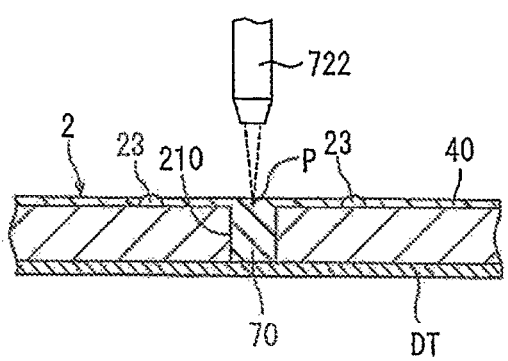
Figure 11D:
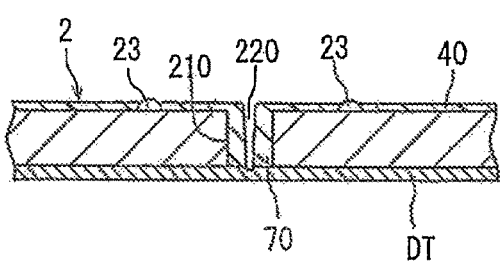

After the molding resin 40 embedded in the grooves 210 formed along the projected dicing lines 21 on the semiconductor wafer 2 held on the chuck table 71 has been detected and aligned with the laser beam applying position, the chuck table 71 is moved to a laser beam applying region where the beam condenser 722 of the laser beam applying means 72 is positioned, as depicted in FIG. 11A. In the laser beam applying region, an end (left end in FIG. 11A) of the molding resin 40 embedded, in a groove 210 is positioned immediately below the beam condenser 722 of the laser beam applying means 72, and the transversely central point on the molding resin 40 embedded in the groove 210 is positioned immediately below the beam condenser 722, as depicted in FIG. 11C. The focused spot P of the pulsed laser beam applied from the beam condenser 722 is positioned near the upper surface of the molding resin 40 that is embedded in the groove 210 and exposed on the face side 2a of the semiconductor wafer 2, as depicted in FIG. 11C. Then, while the pulsed laser beam which has a wavelength absorbable by the molding resin 40 is applied from the beam condenser 722 to the molding resin 40, the chuck table 71 is moved in the direction indicated by the arrow X1 in FIG. 11A at a prescribed feed speed. When the other end (right end in FIG. 11B) of the molding resin 40 embedded in the groove 210 reaches the position irradiated by the pulsed laser beam from the beam condenser 722, the laser beam applying means 72 stops applying the pulsed laser beam and the chuck table 71 is stopped. As a result, as depicted in FIG. 11D, a dividing groove 220 is formed as a laser-processed groove having a width of 10 μm, which allows the semiconductor wafer 2 to be divided into individual devices along the grooves 210, is formed in the molding resin 40 laid on the face side 2a of the semiconductor wafer 2 and the molding resin 40 embedded in the groove 210. The dividing groove 220 is of such a depth that it severs the molding resin 40 embedded in the groove 210 and reaches the dicing tape DT, allowing the semiconductor wafer 2 to be divided into individual devices. In the dividing groove forming step, since the transversely central point on the molding resin 40 embedded in the groove 210 that is detected in the alignment step and exposed on the face side of the outer circumferential portion of the semiconductor wafer 2 is positioned immediately below the beam condenser 722, the pulsed laser beam is applied to the transversely central point on the molding resin 40 embedded in the groove 210 along the groove 210 even though the molding resin 40 is laid on the face side 2a of the semiconductor wafer 2, so that the devices on the semiconductor wafer 2 will not be damaged.

For example, processing conditions in the dividing groove forming step are set as follows:

Light source: YAG pulse laser
Wavelength: 355 nm
Repetitive frequency: 100 kHz
Average output: 2 W
Focused spot diameter: 10 μm
Processing feed speed: 100 mm/second After the dividing groove forming step has been carried out along the molding resin 40 embedded in the groove 210 along a prescribed projected dicing line 21, the chuck table 71 is indexing-fed by a distance corresponding to the interval between adjacent grooves 210 in which the molding resin 40 is embedded, i.e., adjacent projected dicing lines 21, in a direction (indexing feed direction) perpendicular to the sheet of FIG. 11B, and then the above dividing groove forming step is repeated. After the dividing groove forming step has been performed along the molding resin 40 embedded in all the grooves 210 along the first direction, the chuck table 71 is turned 90 degrees, and then the dividing groove forming step is carried out along the molding resin 40 embedded in the grooves 210 along the second direction. The molding resin 40 along the second direction is perpendicular to the molding resin 40 embedded in the grooves 210 along the first direction.

Figure 12:
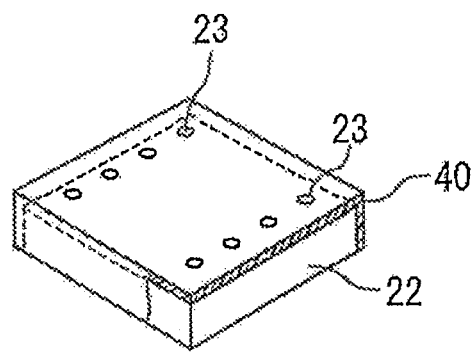
FIG. 12 is a perspective view of an individual package device divided from the semiconductor wafer by the method of processing a wafer according to the embodiment.

As a result of the dividing groove forming step thus carried out, the semiconductor wafer 2 is divided into individual devices 22, i.e. device chips, along the dividing grooves 220, which include laser-processed grooves that sever the molding resin 40 embedded in the grooves 210. As depicted in FIG. 12, each of the individually divided devices 22 includes a package device referred to as WLCSP with its face side and side surfaces covered with the molding resin 40, as depicted in FIG. 12.

In the above embodiment, the molding resin removing step in which the outer circumferential portion of the molding resin 40 laid on the face side 2a of the semiconductor wafer 2 is removed to expose the molding resin 40 embedded in the grooves 210 on the face side 2a of the semiconductor wafer 2 is carried out before the protective member applying step and the reverse side grinding step. However, the molding resin removing step may be carried out after the protective member applying step, the reverse side grinding step, and the wafer supporting step, and before the dividing groove forming step.

Figure 6B:
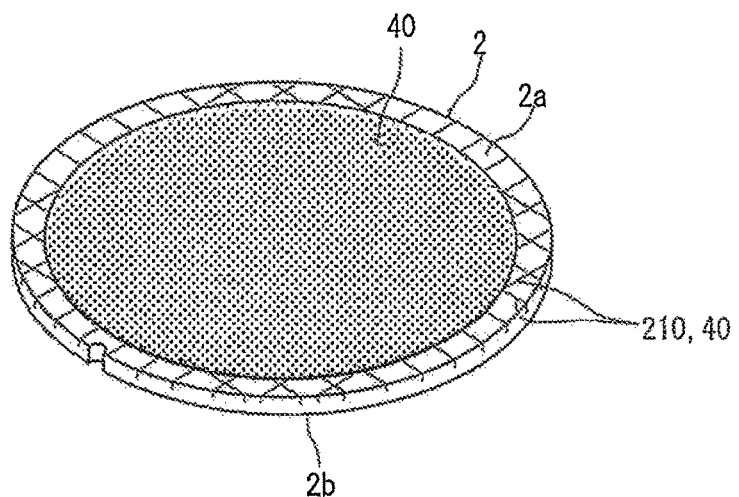
Figure 13:
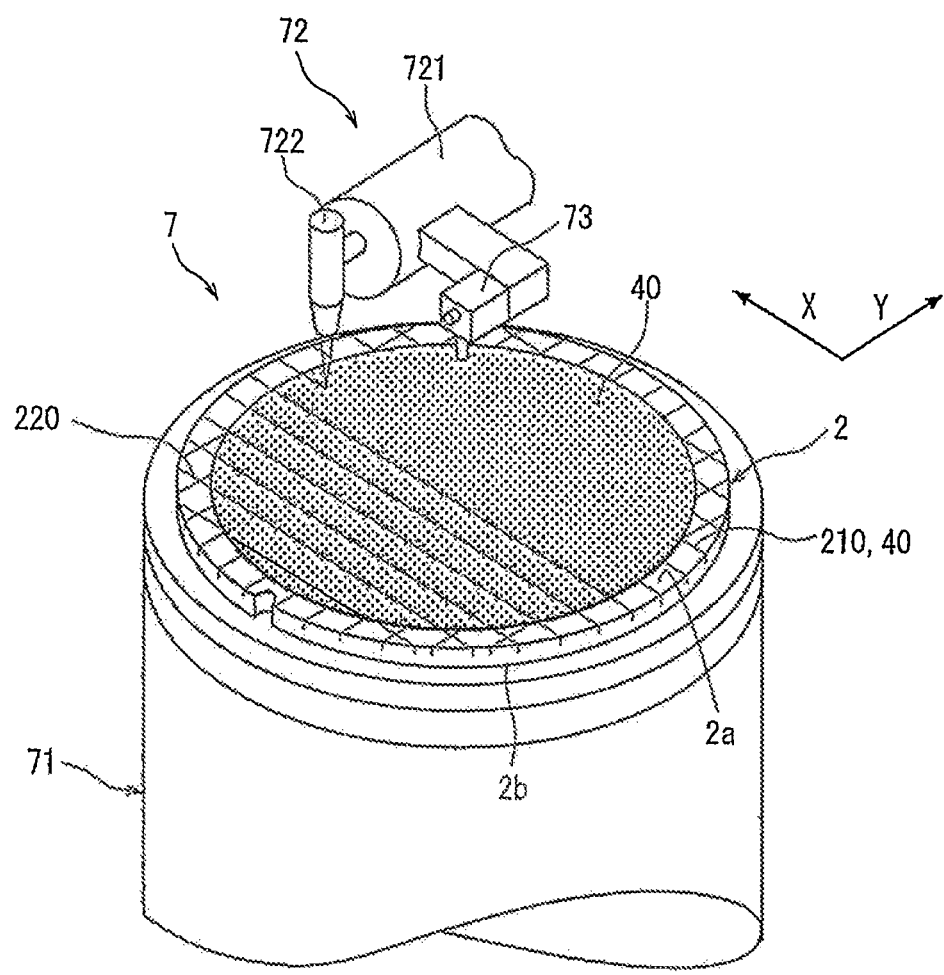
FIG. 13 is a fragmentary perspective view illustrating a dividing groove forming step according to another embodiment of the present invention.

A method of processing a wafer according to another embodiment of the present invention will be described below with reference to FIGS. 13 through 17. According to the other embodiment, after the molding resin removing step depicted in FIGS. 6A and 6B has been carried out, a dividing groove forming step is carried out to detect the molding resin 40 embedded in the groove's 210 exposed on the face side of the outer circumferential portion of the semiconductor wafer 2, position the focused spot of a laser beam at a transversely central point on the molding resin 40 embedded in each of the grooves 210, and apply the laser beam to the molding resin 40 along each of the grooves 210, thereby forming dividing grooves along which to divide the semiconductor wafer 2 into individual devices. The dividing groove forming step is carried out using the laser processing apparatus 7 depicted in FIG. 10. Specifically, as depicted in FIG. 13, the reverse side 2b of the semiconductor wafer 2 on which the molding resin removing step has been carried out is placed on the chuck table 71 of the laser processing apparatus 7. The non-illustrated suction means is actuated to hold the semiconductor wafer 2 on the chuck table 71. Therefore, the semiconductor wafer 2 held on the chuck table 71 has the molding resin 40 on the face side 2a facing upwardly. The chuck table 71 with the semiconductor wafer 2 held under suction thereon is positioned immediately below the image capturing means 73 by the non-illustrated processing feed means.

After the chuck table 71 has been positioned immediately below the image capturing means 73, an alignment step is performed by the image capturing means 73 and the non-illustrated control means to detect a cutting region where the molding resin 40 embedded in the grooves 210 formed in the semiconductor wafer 2 is to be cut. The alignment step is carried out in the same manner as the alignment step in the embodiment depicted in FIG. 10.

Figure 14A:
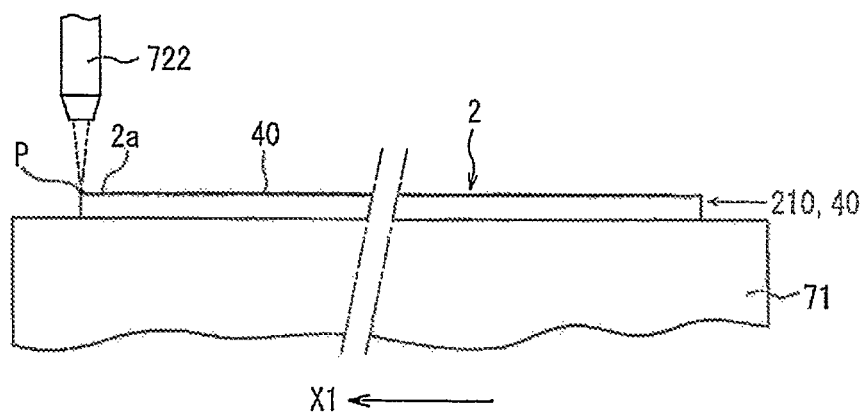
FIGS. 14A through 14D are views illustrating a dividing groove forming step according to the other embodiment.
Figure 14B:
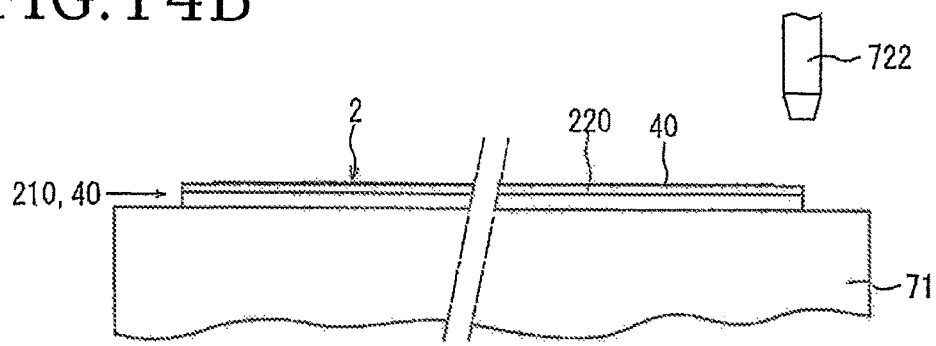
Figures 14C, 14D:
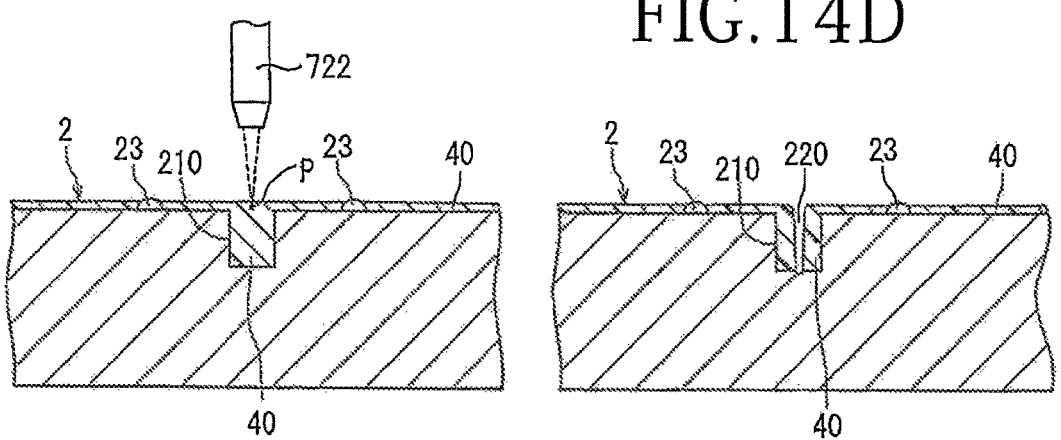

After the molding resin 40 embedded in the grooves 210 formed along the projected dicing lines 21 the semiconductor wafer 2 held on the chuck table 71 has been detected and aligned with the laser beam applying position, the chuck table 71 is moved to a laser beam applying region where the beam condenser 722 of the laser beam applying means 72 is positioned, as depicted in FIG. 14A. In the laser beam applying region, an end (left end in FIG. 14A) of the molding resin 40 embedded in a groove 210 is positioned immediately below the beam condenser 722 of the laser beam applying means 72, and the transversely central point on the molding resin 40 embedded in the groove 210 is positioned immediately below the beam condenser 722, as depicted in FIG. 14C. The focused spot P of the pulsed laser beam applied from the beam condenser 722 is positioned near the upper surface of the molding resin 40 that is embedded in the groove 210 and exposed on the face side 2a of the semiconductor wafer 2, as depicted in FIG. 14C.

Then, while the pulsed laser beam which has a wavelength absorbable by the molding resin 40 is applied from the beam condenser 722 to the molding resin 40, the chuck table 71 is moved in the direction indicated by the arrow X1 in FIG. 14A at a prescribed feed speed. When the other end (right end in FIG. 14B) of the molding resin 40 embedded in the groove 210 reaches the position irradiated by the pulsed laser beam from the beam condenser 722, the laser beam applying means 72 stops applying the pulsed laser beam and the chuck table 71 is stopped. As a result, as depicted in FIG. 14D, a dividing groove 220 is formed as a laser-processed groove having a width of 10 μm, which allows the semiconductor wafer 2 to be divided into individual devices along the grooves 210, is formed in the molding resin 40 laid on the face side 2a of the semiconductor wafer 2 and the molding resin 40 embedded in the groove 210. The dividing groove 220 is of a depth corresponding to the finished device thickness, i.e., such a depth that it severs the molding resin 40 embedded in the groove 210 and reaches the bottom of the groove 210, allowing the semiconductor wafer 2 to be divided into individual devices. In the dividing groove forming step, since the transversely central point on the molding resin 40 embedded in the groove 210 that is detected in the alignment step and exposed on the face side of the outer circumferential portion of the semiconductor wafer 2 is positioned immediately below the beam condenser 722, the pulsed laser beam is applied to e transversely central point on the molding resin 40 embedded in the groove 210 along the groove 210 even though the molding resin 40 is laid on the face side 2a of the semiconductor wafer 2, so that the devices on the semiconductor wafer 2 will not be damaged.

Processing conditions in the dividing groove forming step may be the same as the processing conditions in the dividing groove forming step depicted in FIGS. 10 and 11A through 11D. The dividing groove forming step described above is carried out along all the projected dicing lines 21 formed on the semiconductor wafer 2.

Figure 15A:
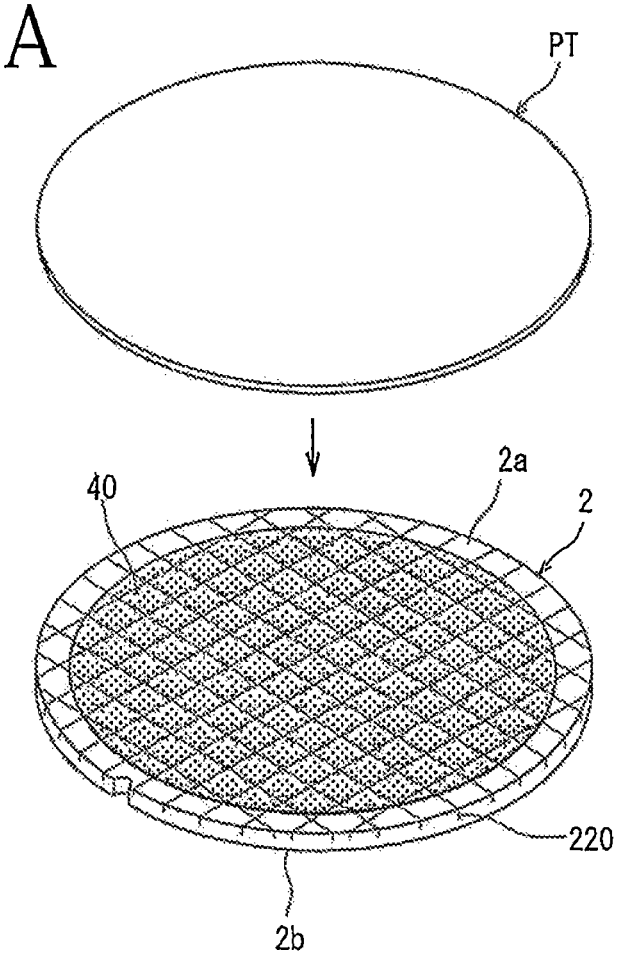
FIGS. 15A and 15B are views illustrating a protective member applying step according to the other embodiment.
Figure 15B:
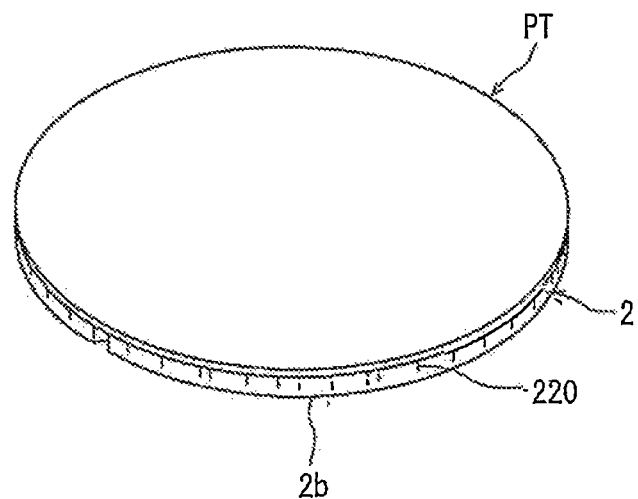

Then, a protective member applying step is carried out to apply a protective member to the face side 2a of the semiconductor wafer 2 on which the dividing groove forming step has been performed. Specifically, as depicted in FIGS. 15A and 15B, a protective tape PT is applied as a protective member to the face side 2a of the semiconductor wafer 2 and the molding resin 40 laid thereon, as depicted in FIGS. 15A and 15B. According to the present embodiment, the protective tape PT includes a sheet-like base of polyvinyl chloride (PVC) having a thickness of 100 μm and coated with a glue of acrylic resin to a thickness of approximately 5 μm.

Figure 16A:
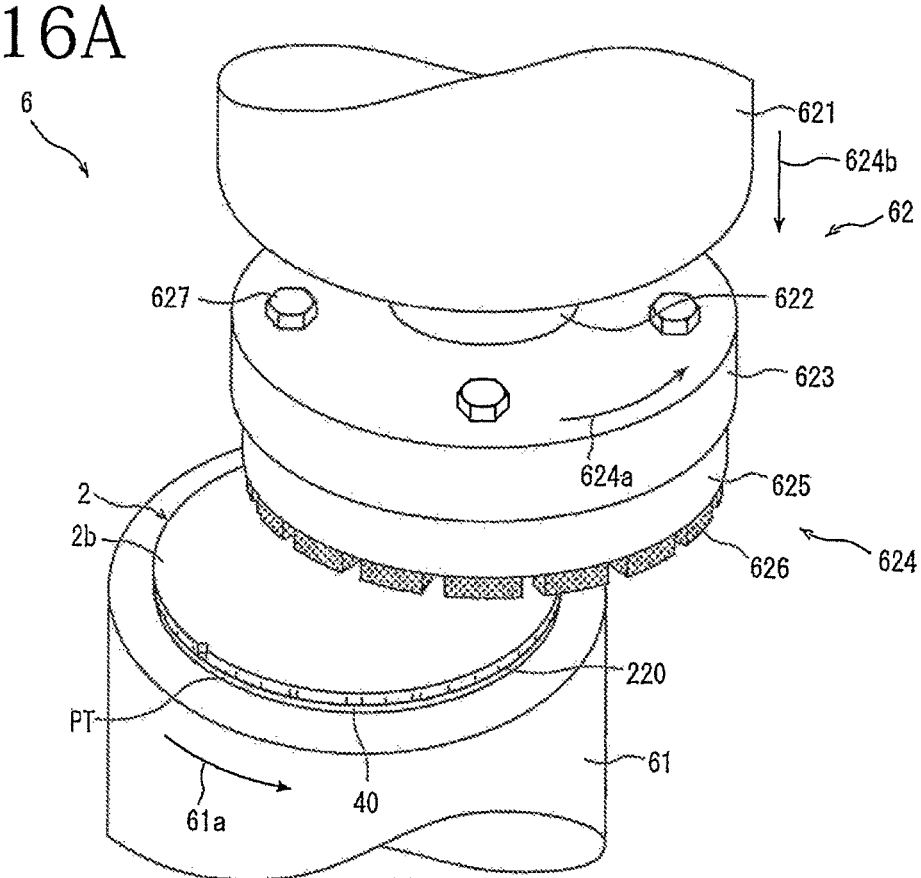
FIGS. 16A through 16C are views illustrating a reverse side grinding step according to the other embodiment.

Then, a reverse side grinding step is carried out to grind the reverse side 2b of the semiconductor wafer 2 on which the protective member applying step has been performed, to the finished device thickness, thereby exposing the dividing grooves 220, which allow the semiconductor wafer 2 to be divided into individual devices. The reverse side grinding step is carried out using the grinding apparatus 6 depicted in FIG. 8A. Specifically, the protective tape PT on the semiconductor wafer 2 on which the protective member applying step has been carried out is placed on the upper surface (holding surface) of the chuck table 61, as depicted in FIG. 16A. Then, the non-illustrated suction means is actuated to hold the semiconductor wafer 2 under suction on the chuck table 61 with the protective tape PT interposed therebetween. Therefore, the semiconductor wafer 2 held on the chuck table 61 has its reverse side 2b facing upwardly.

Figure 16B:
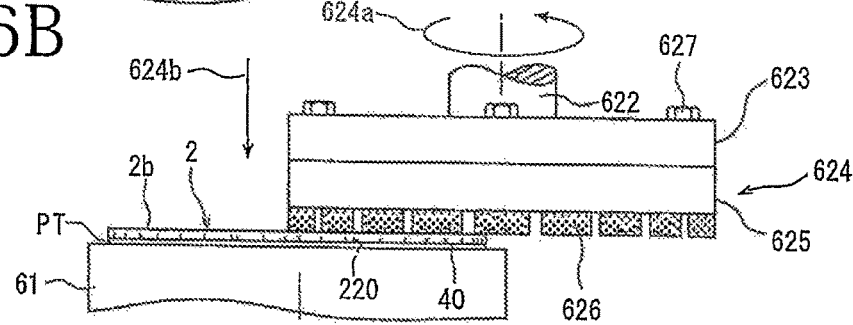
Figure 16C:
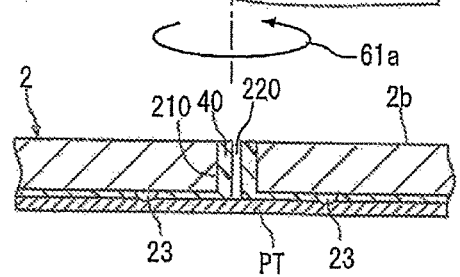

After the chuck table 61 has held the semiconductor wafer 2 under suction thereon with the protective tape PT interposed therebetween, the chuck table 61 is rotated about its own axis at approximately 300 rpm, for example, in the direction indicated, by the arrow 61a in FIG. 16A, while at the same time the grinding wheel 624 of the grinding means 62 is rotated about its own axis at 6000 rpm, for example, in the direction indicated by the arrow 624a in FIG. 16A. As depicted in FIG. 16B, the grinding stones 626 are brought into contact with the reverse side 2b, which serves as a processed surface, of the semiconductor wafer 2, and the grinding wheel 624 is grinding-fed downwardly, i.e., in a direction perpendicular to the holding surface of the chuck table 61, at a grinding-feed speed of 1 μm/second, for example, by a prescribed distance, as indicated by the arrow 624b in FIGS. 16A and 16B. As a result, the reverse side 2b of the semiconductor wafer 2 is ground, exposing the dividing groves 220 on the reverse side 2b of the semiconductor wafer 2, as depicted in FIG. 16C, whereupon the semiconductor wafer 2 is divided into individual devices 22. The divided individual devices 22 are prevented from being separated by the protective tape PT, maintaining the shape of the wafer.

Figure 17:
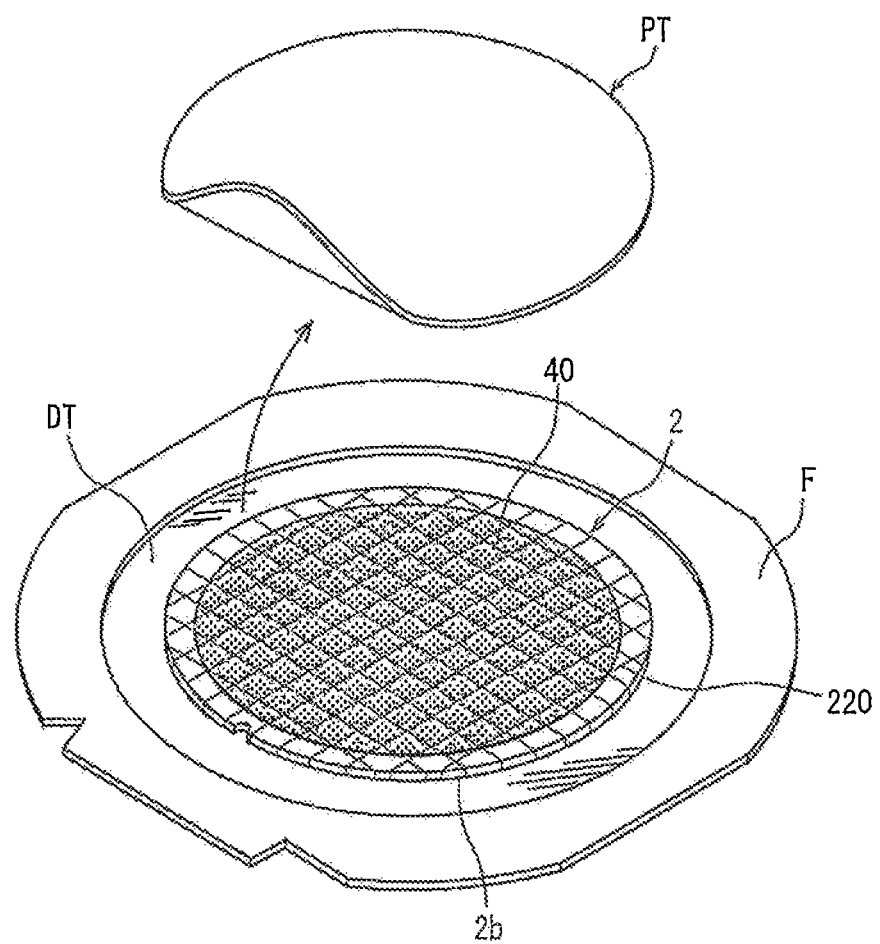
FIG. 17 is a perspective view illustrating a wafer supporting step according to the other embodiment.

Then, a wafer supporting step is carried out to apply a dicing tape to the reverse side 2b of the semiconductor wafer 2 on which the reverse side grinding step has been carried out, mount the outer circumferential portion of the dicing tape on an annular frame F, and peel off the protective tape PT applied to the face side 2a of the semiconductor wafer 2. Specifically, as depicted in FIG. 17, the reverse side 2b of the semiconductor wafer 2 on which reverse side grinding step has been carried out is applied to the face side of a dicing tape DT whose outer circumferential portion is mounted on an annular frame F in a manner to cover the inner opening of the annular frame F. Then, the protective tape PT applied to the face side 2a of the semiconductor wafer 2 is peeled off. Therefore, the semiconductor wafer 2 applied to the surface of the dicing tape DT has the molding resin 410 on the face side 2a facing upwardly. The semiconductor wafer 2 on which the wafer supporting step has been carried out is delivered to a next pickup step where the devices 22 are picked up individually. Each of the devices 22 thus picked up includes a WLCSP with its face side and side surfaces covered with the molding resin 40, as depicted in FIG. 12.

The present invention is not limited to the details of the above described preferred embodiments. The scope of the invention is defined by the appended claims and all, changes and modifications as fall within the equivalence of the scope of the claims are therefore to be embraced by the invention.

What is claimed is:

1. A method of processing a wafer having a plurality of projected dicing lines on a face side thereof, a plurality of devices formed in respective device areas demarcated on the face side of the wafer by the projected dicing lines, a plurality of grooves formed in the projected dicing lines to a depth corresponding to a finished thickness of the devices, and a molding resin laid on the face side of the wafer including the devices and embedded in the grooves, said method comprising:

a molding resin removing step of removing an annular debris resin from an outer circumferential portion of the face side of the wafer that completely surrounds all of the devices, exposing the molding resin embedded in the grooves on the face side of the wafer in the outer circumferential portion of the wafer, without exposing the molding resin in the grooves in the plurality of device areas; and a dividing groove forming step of detecting the molding resin embedded in the grooves exposed on an outer circumferential portion of the wafer, positioning the focused spot of a laser beam at a transversely central point on the molding resin embedded in the grooves, and applying the laser beam to the molding resin along the grooves, thereby forming dividing grooves in the wafer to allow the wafer to be divided into individual devices after performing the molding resin removing step;

wherein the dividing grooves of a depth corresponding to a finished thickness of the devices are formed in the dividing groove forming step, said method further comprising:

a protective member applying step of applying a protective member to the face side of the wafer on which the dividing groove forming step is performed; and a reverse side grinding step of grinding a reverse side of the wafer to a finished thickness of the devices, thereby exposing said dividing grooves to allow the wafer to be divided into the individual devices.

* * * * *